United States Patent
Ignatiev et al.

(10) Patent No.: US 8,124,170 B1
(45) Date of Patent: Feb. 28, 2012

(54) METHOD FOR FORMING SUPERCONDUCTOR MATERIAL ON A TAPE SUBSTRATE

(75) Inventors: Alex Ignatiev, Houston, TX (US); Xin Zhang, Houston, TX (US); Alexander A. Molodyk, Houston, TX (US); Louis D. Castellani, Houston, TX (US)

(73) Assignee: Metal Oxide Technologies, Inc, Houston, TX (US)

( * ) Notice: Subject to any disclaimer, the term of this patent is extended or adjusted under 35 U.S.C. 154(b) by 1353 days.

(21) Appl. No.: 11/038,569

(22) Filed: Jan. 19, 2005

Related U.S. Application Data (60) Provisional application No. 60/539,055, filed on Jan. 23, 2004.

(51) Int. Cl.
*B05D 5/12* (2006.01)
*H01L 39/24* (2006.01)
*C23C 14/00* (2006.01)

(52) U.S. Cl. .......... 427/62; 505/430; 505/434; 505/470; 505/740; 505/741; 204/192.1; 204/192.15; 204/192.24

(58) Field of Classification Search .............. 427/62; 505/430, 434, 470, 740, 741; 204/192.1, 204/192.15, 192.24
See application file for complete search history.

(56) References Cited

U.S. PATENT DOCUMENTS

| | | | |
|---|---|---|---|
| 3,615,881 A | 10/1971 | Greene | |
| 4,389,970 A | 6/1983 | Edgerton | |
| 5,034,372 A | 7/1991 | Matsuno et al. | |
| 5,356,474 A | 10/1994 | Savkar | |
| 6,316,098 B1 | 11/2001 | Yitzchaik et al. | |
| 6,673,387 B1 | 1/2004 | Zhang et al. | |
| 6,906,008 B2 * | 6/2005 | Selvamanickam et al. | 505/434 |
| 2003/0127051 A1 * | 7/2003 | Fritzemeier et al. | 118/715 |
| 2004/0247779 A1 * | 12/2004 | Selvamanickam et al. | 427/62 |

FOREIGN PATENT DOCUMENTS

| | | | |
|---|---|---|---|
| EP | 0334374 | * | 9/1989 |
| JP | 04-218216 | | 8/1992 |
| JP | 04218216 | * | 8/1992 |
| JP | 06-228741 | | 8/1994 |
| JP | 06-293596 | | 10/1994 |
| JP | 09-052701 | | 2/1997 |
| JP | 09-147647 | | 6/1997 |

* cited by examiner

*Primary Examiner* — Brian K Talbot
(74) *Attorney, Agent, or Firm* — Finnegan, Henderson, Farabow, Garrett & Dunner, LLP (57) ABSTRACT

A method for forming a superconducting wire with a tape substrate comprises dispensing the tape substrate, providing at least one reactor chamber to form at least one buffer material on the tape substrate based on determining at least one of a type of tape substrate, a type of superconductor material, and a type of buffer material, providing another reactor chamber to continuously form a layer of the superconductor material on a layer of the buffer material, and spooling the tape substrate with the layer of superconductor material.

11 Claims, 9 Drawing Sheets

METHOD FOR FORMING SUPERCONDUCTOR MATERIAL ON A TAPE SUBSTRATE

CROSS-REFERENCE TO RELATED APPLICATIONS

This application is a continuation-in-part of and claims priority to U.S. patent application Ser. No. 10/206,123 and also claims priority to U.S. Provisional Patent Application No. 60/539,055, the disclosures of which are hereby incorporated herein by reference. This application is related to co-pending and commonly assigned U.S. patent application Ser. No. 10/206,123, entitled "METHOD AND APPARATUS FOR FORMING SUPERCONDUCTOR MATERIAL ON A TAPE SUBSTRATE," filed Jul. 26, 2002, to co-pending and commonly-assigned U.S. patent application Ser. No. 10/206,900, entitled "SUPERCONDUCTOR MATERIAL ON A TAPE SUBSTRATE," filed Jul. 26, 2002, and concurrently filed and commonly assigned U.S. patent application Ser. No. 10/206,783, entitled "METHOD AND APPARATUS FOR FORMING A THIN FILM ON A TAPE SUBSTRATE," filed Jul. 26, 2002, to U.S. patent application Ser. No. 11/039,711 filed concurrently herewith and entitled "SYSTEM AND METHOD FOR JOINING SUPERCONDUCTIVITY TAPE," and to U.S. patent application Ser. No. 11/038,769 filed concurrently herewith and entitled "SYSTEM AND METHOD FOR QUALITY TESTING OF SUPERCONDUCTIVITY TAPE," the disclosures of which are hereby incorporated herein by reference.

TECHNICAL FIELD

This invention relates in general to superconductors, and in specific to a method and apparatus for forming superconductor material on tape substrate

BACKGROUND OF THE INVENTION

Electrical resistance in metals arises because electrons that are propagating through the solid are scattered because of deviations from perfect translational symmetry. These deviations are produced either by impurities or the phonon lattice vibrations. The impurities form the temperature independent contribution to the resistance, and the vibrations form the temperature dependent contribution.

Electrical resistance, in some applications, is very undesirable. For example, in electrical power transmission, electrical resistance causes power dissipation, i.e. loss. The power dissipation grows in proportion to the square of the current, namely $P=I^2R$ in normal wires. Thus, wires carrying large currents dissipate large amounts of energy. Moreover, the longer the wire used in either larger transformers, bigger motors or larger transmission distances, the more dissipation, since the resistance in a wire is proportional to its length. Thus, as wire lengths increase more energy is lost in the wires, even with a relatively small currents. Consequently, electric power plants produce more energy than that which is used by consumers, since a portion of the energy is lost due to wire resistance.

In a superconductor that is cooled below its transition temperature $T_C$, there is no resistance because the scattering mechanisms are unable to impede the motion of the current carriers. The current is carried, in most known classes of superconductor materials, by pairs of electrons known as Cooper pairs. The mechanism by which two negatively charged electrons are bound together is described by the BCS (Bardeen Cooper Schrieffer) theory. In the superconducting state, i.e. below $T_C$, the binding energy of a pair of electrons causes the opening of a gap in the energy spectrum at $E_f$, which is the Fermi energy or the highest occupied level in a solid. This separates the pair states from the "normal" single electron states. The size of a Cooper pair is given by the coherence length which is typically 1000 Å, although it can be as small as 30 Å in the copper oxides. The space occupied by one pair contains many other pairs, which forms a complex interdependence of the occupancy of the pair states. Thus, there is insufficient thermal energy to scatter the pairs, as reversing the direction of travel of one electron in the pair requires the destruction of the pair and many other pairs due to the complex interdependence. Consequently, the pairs carry current unimpeded. For further information on superconductor theory please see "Introduction to Superconductivity," by M. Tinkham, McGraw-Hill, New York, 1975.)

Figure 1:
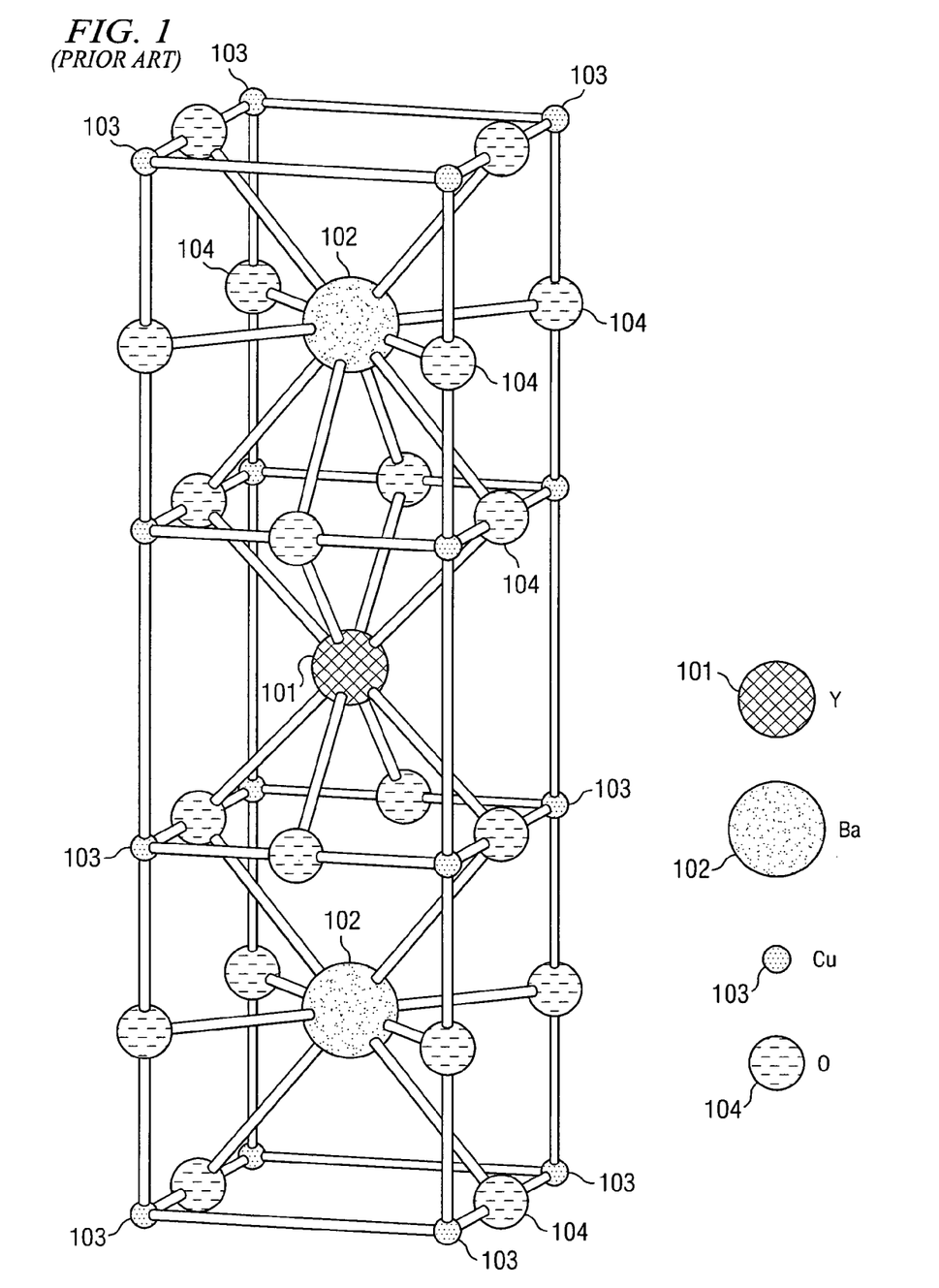
FIG. 1 depicts a known atomic structure for a YBCO superconductor.

Many different materials can become superconductors when their temperature is cooled below $T_C$. For example, some classical type I superconductors (along with their respective $T_C$'s in degrees Kelvin (K)) are carbon 15K, lead 7.2K, lanthanum 4.9K, tantalum 4.47K, and mercury 4.47K. Some type II superconductors, which are part of the new class of high temperature superconductors (along with their respective $T_C$'s in degrees K), are $Hg_{0.8}Tl_{0.2}Ba_2Ca_2Cu_3O_{8.33}$ 138K, $Bi_2Sr_2Ca_2Cu_3O_{10}$ 118 k, and $YBa_2Cu_3O_7$-$x$ 93K. The last superconductor is also well known as YBCO superconductor, for its components, namely Yttrium, Barium, Copper, and Oxygen, and is regarded as the highest performance and highest stability high temperature superconductor, especially for electric power applications. YBCO has a Perovskite structure. This structure has a complex layering of the atoms in the metal oxide structure. FIG. 1 depicts the structure for $YBa_2Cu_3O_7$, that include Yttrium atoms 101, Barium atoms 102, Copper atoms 103, and Oxygen atoms 104. For further information on oxide superconductors please see "Oxide Superconductors", Robert J. Cava, J. Am. Ceram. Soc., volume 83, number 1, pages 5-28, 2000.

A problem with YBCO superconductors specifically, and the oxide superconductors in general, is that they are hard to manufacture because of their oxide properties, and are challenging to produce in superconducting form because of their complex atomic structures. The smallest defect in the structure, e.g. a disordering of atomic structure or a change in chemical composition, can ruin or significantly degrade their superconducting properties. Defects may arise from many sources, e.g. impurities, wrong material concentration, wrong material phase, wrong processing temperature, poor atomic structure, and improper delivery of materials to the substrate, among others.

Figure 2:
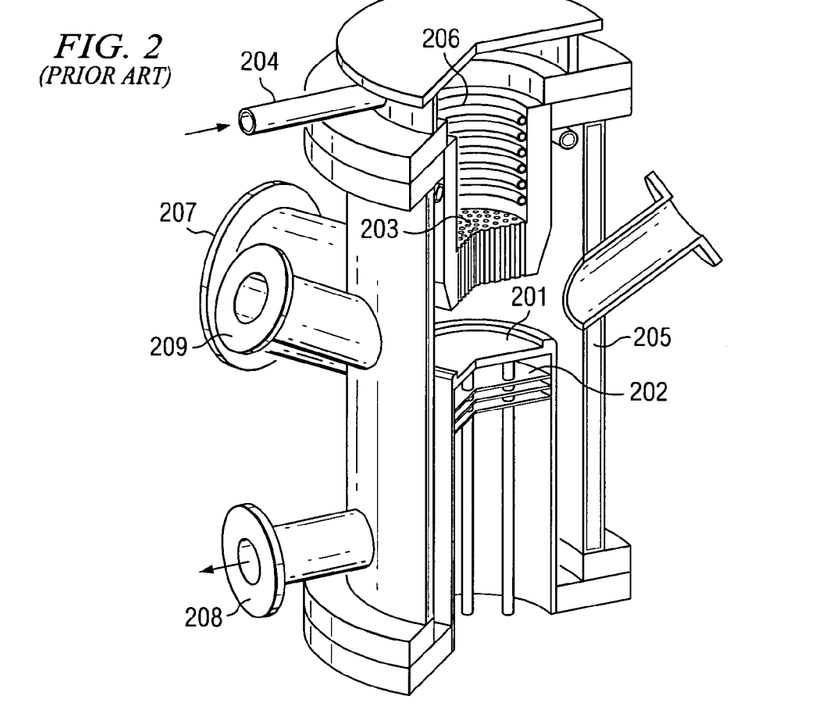
FIG. 2 depicts a first prior art arrangement for producing a YBCO superconductor.

Thin film YBCO superconductors can be fabricated in many ways including pulsed laser deposition, sputtering, metal organic deposition, physical vapor deposition, and chemical vapor deposition. Two typical ways for the deposition of thin film YBCO superconductors are described here as example. In the first way, the YBCO is formed on a wafer substrate in a reaction chamber 200, as shown in FIG. 2 by metal organic chemical vapor deposition (MOCVD). This manner of fabrication is similar to that of semiconductor devices. The wafer substrate is placed on holder 201. The substrate is heated by heater 202. The wafer substrate is also rotated which allows for more uniform deposition on the substrate wafer, as well as more even heating of the substrate. Material, in the form of a gas, is delivered to the substrate by shower head 203, via inlet 204. The shower head 203 provides a laminar flow of the material onto the substrate wafer. The material collects on the heated wafer substrate to grow the superconductor. Excess material is removed from the chamber 200 via exhaust port 208, which is coupled to a pump. To prevent undesired deposition of material onto the walls of the chamber 200, coolant flows through jackets 205 in the walls. To prevent material build up inside the shower head 203, coolant flows through coils 206 in the shower head. The flanges port 207 allows access to the inside of the chamber 200 for insertion and removal of the film/substrate sample. Processing of the film may be monitored through optical port 209.

Figure 3:
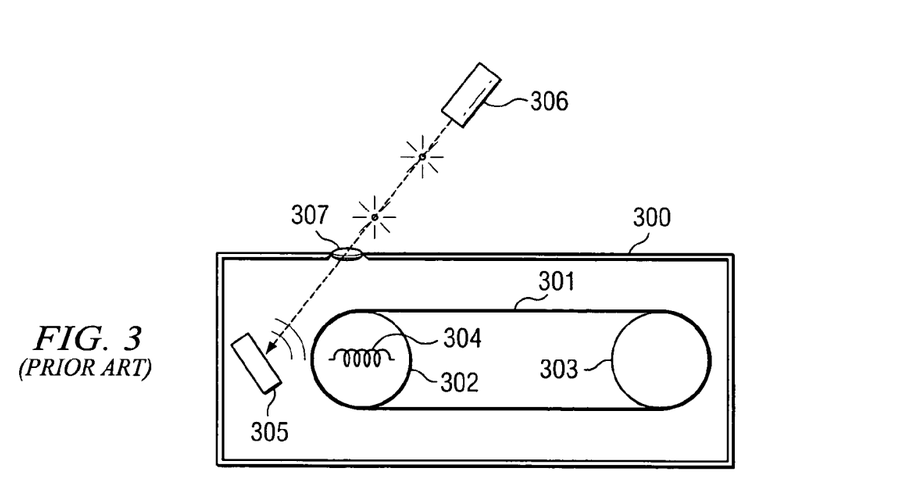
FIG. 3 depicts a second prior art arrangement for producing a YBCO superconductor.

In the second way, YBCO is formed by pulsed laser deposition on a substrate, including the possibility of using a continuous metal tape substrate 301. The tape substrate 301 is supported by two rollers 302, 303 inside of a reaction chamber 300. Roller 302 includes a heater 304, which heats the tape 301 up to a temperature that allows YBCO growth. The material 305 is vaporized in a plume from a YBCO target by irradiation of the target by typically an excimer laser 306. The vapor in the plume then forms the YBCO superconductor film on the substrate 301. The rollers 302, 303 allow for continuous motion of the tape past the laser target thus allowing for continuous coating of the YBCO material onto the tape. Note that the laser 306 is external to the chamber 300 and the beam from the laser 306 enters the chamber 300 via optical port 307. The resulting tape is then cut, and forms a tape or ribbon that has a layer of YBCO superconductive material.

Neither of the above described methods for forming thin film high temperature superconductors can produce a long length tape or ribbon of YBCO which can be used to replace copper (or other metal) wires in electric power applications. The first way only allows for the production of small pieces of superconductor material on the wafer, e.g. a batch process. The second way can only be used to make tape that is a few feet in length and uses multiple passes to generate a superconducting film of several microns thickness. The second way has a practical limitation of about 5 feet. Larger pieces of tape would require a larger heating chamber. A larger heating roller will also be needed. The tape will cool down after leaving roller 302, and thus will need more time to heat back up to the required temperature. Heating on one side of the chamber, with a cool down on the other side of the chamber may also induce thermal cracks into the YBCO layer and other layers formed on the metal substrate. The smaller pieces of tape produced by the second method may be spliced together to form a long length tape, but while the pieces may be superconducting, splice technology is not yet at the point of yielding high quality high temperature superconductor splices. Consequently, current arrangements for forming superconductors cannot form a long, continuous tape of superconductor material.

BRIEF SUMMARY OF THE INVENTION

Embodiments of the present invention are directed to a system and method where there is a need in the art for an arrangement that would allow for the formation of a superconductor, preferably YBCO, onto a metal ribbon or tape or wire, in a continuous manner, so as to form a continuous, long-length superconductor ribbon or tape or wire. Note that the term superconducting wire, as used herein, includes any superconducting element used for transporting current.

These and other objects, features, and technical advantages are achieved by a system and method which continuously deposits materials used to grow a superconductor layer onto a moving tape. The embodiments use a pay-out reel to dispense the tape substrate at a constant rate. Embodiments then use an initialization stage to preheat and/or pretreat the tape substrate before growing the additional layers required for a superconducting wire. Preheating is desirable to lessen thermal shock of the tape substrate. Pretreating is desirable to reduce contaminants from the tape substrate before growing the additional layers required for a superconducting wire. Embodiments then use at least one reactor or reaction chamber to deposit one or more materials onto the tape substrate that is used to form the superconducting wire. The number of reactors needed depends upon the type superconductor material that is being formed, the type and number of buffer layers that are needed (if any) between the superconductor material and the tape substrate, and the type of tape substrate that is used to support the superconductor material. In addition, multiple reactors can be used to form a superconducting wire with multiple buffer layer/superconducting layer groups. Embodiments of the invention are modular such that reactors may be added or removed as needed. Embodiments use an anneal stage to finalize the superconductor layer and cool down the superconducting tape. Embodiments use a take-up reel to spool the superconducting tape. Embodiments may optionally use a coating stage that deposits a protective coating onto the superconducting tape and/or applies a protective interleaving layer to the tape. The interleaving layer is used in the storage, transportation, and packaging of the superconductor tape. This prevents the tape from sticking to itself when stored in reel form. Embodiments also may optionally use a quality control stage that ensures the proper characteristics of the superconducting tape. The embodiments may further optionally use a precleaning stage that removes grease and/or other contaminants from the tape prior to entry into the initialization stage.

Embodiments use transition chambers between the initialization stage and the reaction chamber, between the reaction chamber and the anneal stage, and between reaction chambers if more than one chamber is used. Additional reaction chambers or reactors may be used to provide buffer layers between the substrate and the high temperature superconducting (HTS) film, or coating layers on top of or in between layers of the HTS film. The transition chambers isolate each stage or reactor from the other stages and/or reactors, and thereby prevent cross-contamination of materials from one stage or reactor to another stage or reactor. The transition chamber is differentially pumped with narrow slits at either end through which the tape substrate is passed. The transition chamber includes a heating element that allows the temperature of the tape to be maintained and/or adjusted. The transition chamber includes at least one port to allow the introduction of at least one gas to control the environment in the transition chambers for optimal maintenance of the superconductor or buffer layers, and can incorporate tape monitoring for process control. The transition chamber may include at least one support that holds the tape during its transit through the transition chamber.

The reactor includes at least one support that holds the tape during its transit through the reactor. The reactor also includes a heating system that has a length in the direction of tape movement that is associated with the speed of the tape and the deposition of the material and/or growth rate of the superconductor layer. Thus, a portion of tape will be heated long enough so that a desired thickness of material (preferably, from 1 µm up to more than 10 µm) is achieved, as the portion of the tape is moved through the reaction region (thin film growth region) of the reactor. The reactor also uses a showerhead to provide a laminar flow of material onto the tape. The reactor further uses a cooling system to reduce the build up of material in undesired locations.

Embodiments of the invention may be used to form superconducting tape from different superconducting materials, including, but not limited to $YBa_2Cu_3O_{7-x}$, YBCO, $NdBa_2Cu_3O_{7-x}$, $LaBa_2Cu_3O_{7-x}$, $Bi_2Sr_2Ca_2Cu_3O_y$, $Pb_{2-x}Bi_xSr_2Ca_2Cu_3O_y$, $Bi_2Sr_2CaCu_2O_z$, $Tl_2Ba_2CaCu_2O_x$, $Tl_2Ba_2Ca_2Cu_3O_y$, $TlBa_2Ca_2Cu_3O_z$, $Bi_xSr_{2-y}Ba_yCa_2Cu_4O_z$, $TlBa_2CaCu_2O_z$, $HgBa_2CaCu_2O_y$, $HgBa_2Ca_2Cu_3O_y$, $MgB_2$, copper oxides, rare earth metal oxides, and other high temperature superconductors. Furthermore, the embodiments may operate for many different thin film deposition processes, including but not limited to metalo-organic chemical vapor deposition (MOCVD), pulsed laser deposition, dc/rf sputtering, vapor deposition, metal organic deposition, molecular beam epitaxy, and sol gel processing.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 4:
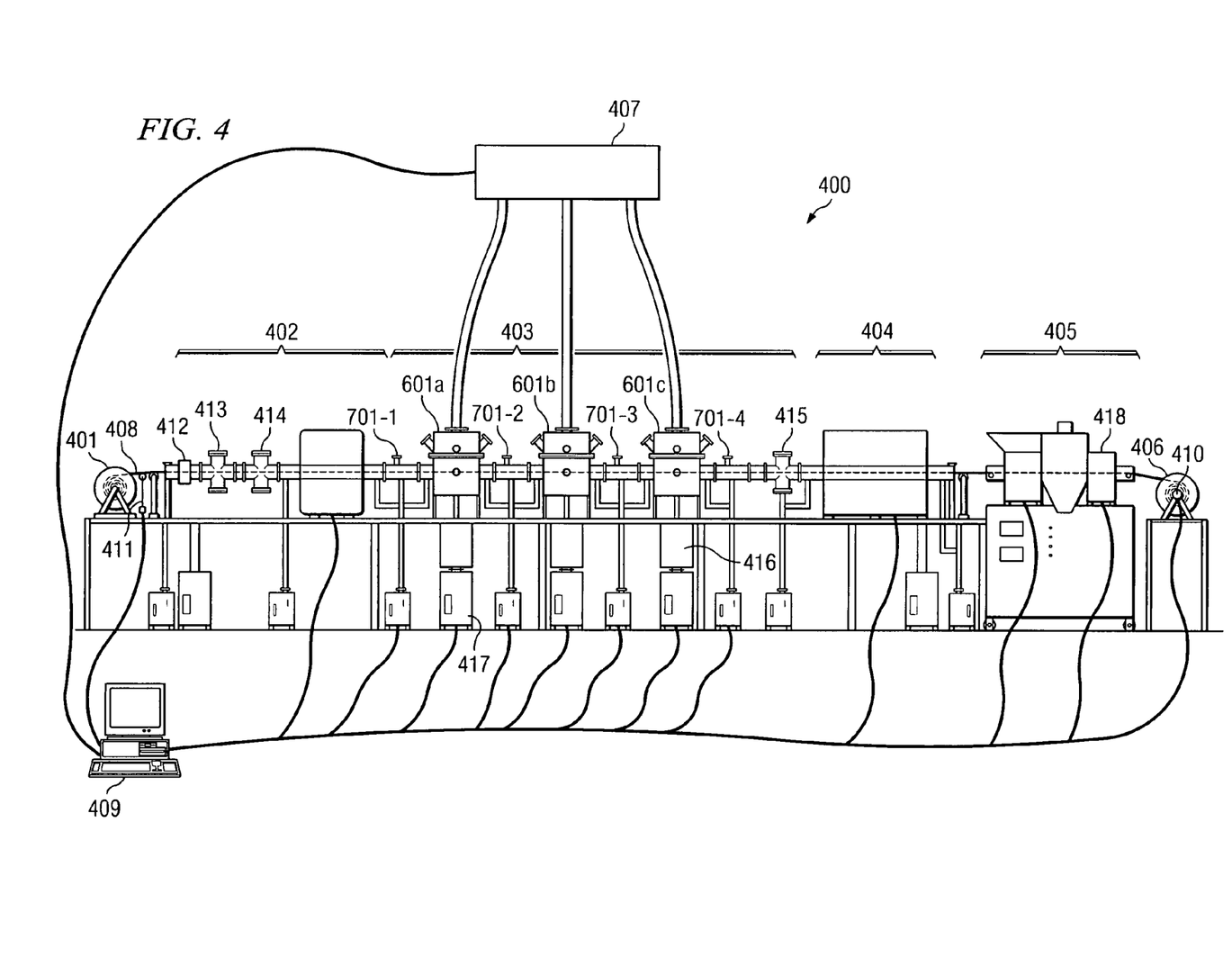
FIG. 4 depicts an example of an embodiment of the invention.

FIG. 4 is a schematic diagram of an embodiment of a system 400 that produces a continuous tape of high temperature super-conducting (HTS) material. The system 400 includes several stages that operate together to deposit superconducting material onto a metallic substrate, such that the HTS material is atomically ordered with large, well-oriented grains and principally low angle grain boundaries. The atomic ordering allows for high current densities, e.g. $J_C$ greater than or equal to 100,000 amps per $cm^2$.

The metallic substrate may be a metal foil tape 408 that is from $10/1000$ to $1/1000$ of an inch thick. The tape may be as wide as desired. For example, the tape may be wide so that the resulting HTS tape can carry a large amount of current, or the tape may be wide so that the resulting HTS tape can be cut into narrower strips.

The tape 408 may be composed of nickel and/or a nickel alloy, and has a predetermined atomic ordering which will promote growth of the HTS material. The tape may also comprise nickel, silver, palladium, platinum, copper, aluminum, iron, tungsten, tantalum, vanadium, chromium, tin, zinc, molybdenum, and titanium. Such a tape has been described by Oak Ridge National Laboratories. The tape 408 supports the HTS layer, and thus should be ductile or flexible, as well as strong. Note that as described herein, only one side of the tape is being coated with a HTS layer, however, both sides may be coated with a HTS layer.

The tape 408 is dispensed by pay-out reel 401. The pay-out reel 401 is a continuous feed reel which provides the tape at a constant speed. The pay-out reel (along with take-up reel 406) is tension controlled to prevent sagging of the tape (too little tension) or stretching or breaking of the tape (too much tension). Either sagging or stretching the tape during processing (e.g. when the tape is heated to high temperature) can damage or destroy the HTS layer. A computer 409 may control the tension of tape, via tension controller 411, as the tape transits from the pay-out reel 401 to the take-up reel 406. Note that pay-out reel 401 is exposed to the room environment. Similarly, the take-up reel 406 is also exposed to the room environment. Thus, system 400 embodies air-to-air processing, which makes processing much easier.

The speed of the tape depends upon a number of factors, e.g. size of the reaction chambers, desired thickness of the deposited materials, growth rate of the layers, temperature of the reaction, photo/flux, etc. A speed of about 3 cm per minute is suitable to continuously grow a YBCO HTS layer of about 0.5 to 5 micrometers in thickness. However, a speed of from 1 to 20 cm per minute may be used, depending on factors such as (but not limited to) desired thickness, growth rates, materials being used, material concentrations, etc. A speed controller 410 that comprises a stepper motor, which can be adjustable set, is used to control the speed of the tape. A computer 409 may control the speed of tape, via speed controller 410, as the tape transits from the pay-out reel 401 to the take-up reel 406. Note that pay-out reel may also comprise a speed controller that may also be connected to the computer 409.

The tape 408 should be clean and free of grease and/or other contaminants. Such contaminants can prevent deposition of materials, can chemically contaminate deposited materials, and can distort the resulting thin film structure, in most cases adversely affecting superconducting properties. A vapor degreaser or cleaner can be used in pre-clean stage 412 to clean the tape prior to its entry into the initialization stage 402. Alternatively, a mechanical cleaner, e.g. a roller wiper can be used to clean the tape. Another alternative is to use an ultrasonic bath, with a liquid cleaner, e.g. acetone, to clean the tape. Residual cleaning agents would be evaporated and/or burned off of the tape by initialization stage 402. Note that pre-clean stage 412 may comprise multiple applications of vapor, mechanical, or bath treatments, as well as combinations of vapor, mechanical, and/or bath treatments. Further note that this stage may be operated separately from system 400. The resulting cleaned tape could then be re-spooled and used in system 400 as tape 408.

Initialization stage 402 pre-heats and/or pre-treats the tape substrate 408 before growing the additional layers required for a superconducting tape. This stage raises the temperature of the tape 408 to about 500° C. This temperature is between room temperature and the temperature of the next stage. This will reduce thermal shock of the tape substrate. Pre-treating will reduce contaminants from the tape substrate before growing surface layers including the top superconductor layer. This stage also removes the native oxide that covers metals. This stage has a reducing atmosphere that preferably comprises an oxygen scavenger, e.g. hydrogen ($H_2$), and for ammonia ($NH_3$), and argon (and/or other non-reacting gas e.g. nitrogen). The scavenger reacts with the metal surface oxide to reduce it to bare metal. The surface metal oxide could disrupt the atomic order of the HTS layer, affecting its superconducting properties, and thus should be removed.

Figure 5:
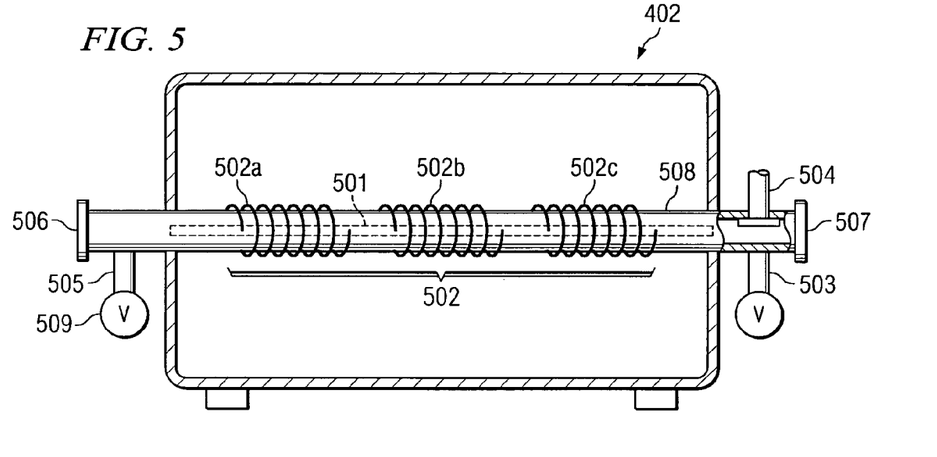
FIG. 5 depicts an embodiment of an initialization stage of the invention.

An example of an embodiment of the initialization stage 402 is shown in FIG. 5. This stage includes at least one support 501, and is composed of stainless steel. Other materials could include quartz, gold, platinum, aluminum oxide, $LaAlO_3$, $SrTiO_3$, and/or other metal oxide materials. The support should be polished smooth, so as not to snag or kink the tape, which would damage the atomic ordering of the substrate, and result in reduced quality HTS film. Also, the support should only be as large as necessary to prevent sag, this will minimize contact with the tape and prevent contamination. Heater 502 is used to heat the tape. Heater 502 may comprise a plurality of stages, e.g. 502a, 502b, 502c, wherein each stage incrementally heats the tape to a desired temperature. This will reduce thermal shock of the tape substrate. Note that in this embodiment, the heater includes supporting pipe 508. This pipe has a plurality of ports (not shown), which allows the passage of gases and/or other materials into and/or out of the pipe. The tape feeds into this stage via tape port 506 and passes out of this stage via tape port 507. Note that tape ports 506 and 507 are not required to be narrow slits, like those on the transition chambers 701. Alternatively, the narrow slits may not be part of the transition chambers, and instead tape ports 506 and 507 may comprise narrow slits. Material port 504 provides an inlet for the gases (if any) that are to be used to define the environment in this stage. Ports 503, 505 may be connected to one or more vacuum sources 509 to prevent leakage of the atmosphere into an adjacent stage and/or leakage of the atmosphere of an adjacent stage into stage 402. Note that instead of using coil heater(s), lamp heater(s) similar to those shown in FIG. 8 may be used.

The following table provides a working example of the environment of the initialization stage. The values are preferred values, as well as useable values, that are provided by way of example only. Note that SCCM is standard cubic centimeters per minute.

TABLE I

INITIALIZATION STAGE 402

| Variable | Preferred | Operating |
| --- | --- | --- |
| Input Tape Temperature | Room Temperature | Room Temperature |
| Output Tape Temperature | 600° C. | 200-650° C. |
| Pressure | 5-30 Torr | 1-700 Torr |
| Gas Flow Rate | 500-1000 SCCM | 100-2000 SCCM |
| Gas Composition: $H_2$ | 5% | 3%-30% |
| Ar | 95% | 97%-70% |

Figure 6A:
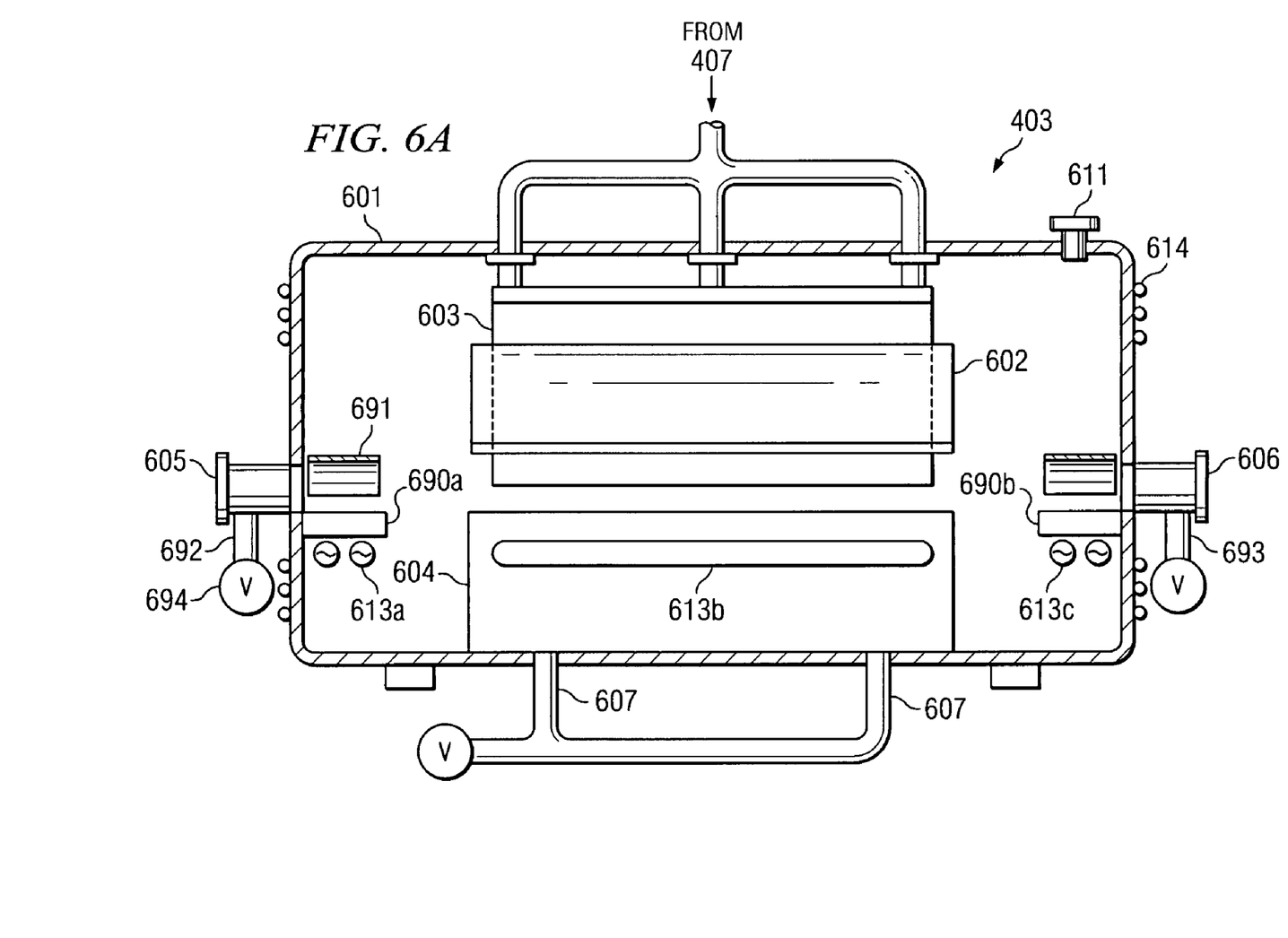
FIGS. 6A-6F depict an embodiment of a reactor of a deposition stage of the invention.

The next stage is the deposition stage 403. This stage preferably comprises at least one reactor or reaction chamber 601 to deposit one or more materials onto the tape substrate onto which the superconductor layer is deposited. The number of reactors needed depends upon the type superconductor material that is being formed, the type and number of buffer layers that are needed (if any) between the superconductor material and the tape substrate, and the type of tape substrate that is used to support the superconductor material. This system is modular such that reactors may be added or removed as needed. For example, suppose that the superconductor material is YBCO and the tape substrate is nickel. Further suppose that two buffer layers are going to be used, e.g. cerium oxide and yittria stabilized zirconia. Thus, a total of three reactor chambers would be needed, one for the YBCO, and one for each of the buffer layers. As another example, if only one buffer layer was to be used, e.g. Sm-doped or "Samarium-doped ceria," then only two reactor chambers would be needed, i.e. one for the superconductor material and one for the buffer material. As a further example, if the superconductor material were to be directly formed on the tape substrate, then only one reactor chamber would be needed. In any event, the system is modular, such that the system may be modified to add or remove reactor chambers as needed.

Further note that an unused reactor chamber does not have to be physically removed from the system. For example a system may comprise three reactor chambers, however only two chambers are needed to produce the superconductor material. Thus, one reactor chamber may be physically removed from the system. Alternatively, one reactor may be set to a neutral operating mode. This mode would have the reactor not in an off mode, but rather would maintain the tape at a predetermined temperature and provide a non-reactive atmosphere to the tape substrate. Thus the tape would pass through the neutral reactor and not be changed by the reactor, and would exit the neutral reactor with essentially the same characteristics with which it entered the neutral reactor.

Figure 7A:
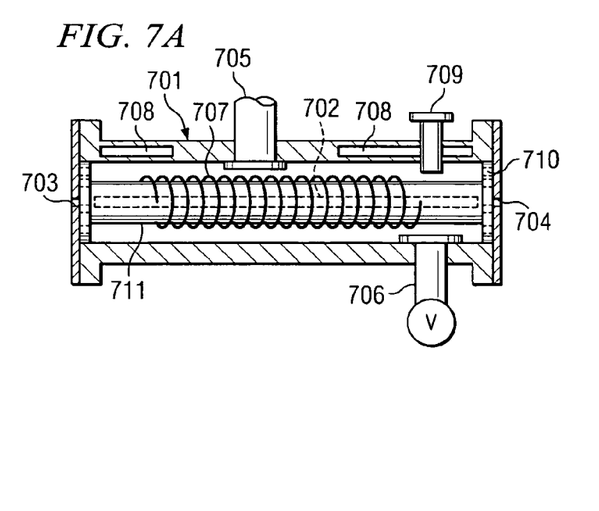
FIGS. 7A and 7B depict an embodiment of a transition chamber of the invention.

As shown in FIG. 4, this section may comprise multiple reaction chambers 601a, 601b, 601c which may be separated by transition chamber 701 in FIG. 7A. Particular superconductors may require the deposition of different materials, different concentrations, different temperatures, different pressures, and/or combinations thereof that would require more than one different operating environment. Each reaction chamber is preferably similar, however the reaction chambers may be made larger or smaller in the direction of tape travel if a particular environment needs a particularly longer or shorter growing time, and/or the layer needs to be thicker or thinner. Note that since the tape is moving at a constant speed, time can be equated to distance, such that if a longer deposition time is needed (and/or a thicker film is needed), then the reactive zone would be longer or the film grows thicker, higher, and vice versa. Similarly, changing the tape speed will also change the deposition time, e.g. slowing the tape will result in longer deposition times and thicker films, and vice versa.

FIG. 6A depicts an example of an embodiment of a reactor 601. The reactor includes at least one support 604, preferably composed of stainless steel. Other materials could include quartz, gold, platinum, aluminum oxide, $LaAlO_3$, $SrTiO_3$, and/or other metal oxide materials. The support should be polished smooth, so as not to snag or kink the tape, which would damage the atomic ordering of the substrate, and result in reduced quality HTS film. Also, the support should only be as large as necessary to prevent sag, this will minimize contact with the tape and prevent contamination. The support may include a heater to supplement heat provided by the heating element 613b, e.g. a lamp. This prevents the support from acting as a heat sink. The sides of the reactor may comprise stainless steel or may comprise some other material, such as quartz, e.g., gold, platinum, aluminum oxide, $LaAlO_3$, $SrTiO_3$, and/or other metal oxide materials. Note that various sensors may be placed throughout the system to provide data regarding the operation of the system, e.g. environmental data, speed of the tap, tape temperature, etc. For example, temperature sensor 694 may be located in the support 604 as shown in FIG. 6E.

The tape feeds into this stage via tape port 605 and passes out of this stage via tape port 606. Note that tape ports 605 and 606 are not required to be narrow slits, like those on the transition chambers 701. Alternatively, the narrow slits may not be part of the transition chambers, and instead tape ports 605 and 606 may comprise narrow slits. Material ports 607 provide an outlet for the materials that are to be used in this stage and are connected to vacuum pumps with gauging and valve control. As shown in the bottom view of a reactor 601 of FIG. 6D, the ports 607 are arranged to facilitate a laminar flow of materials in the reactor 601. In other words, material flows in from the shower head 603 and then out through ports 607.

Figure 6B:
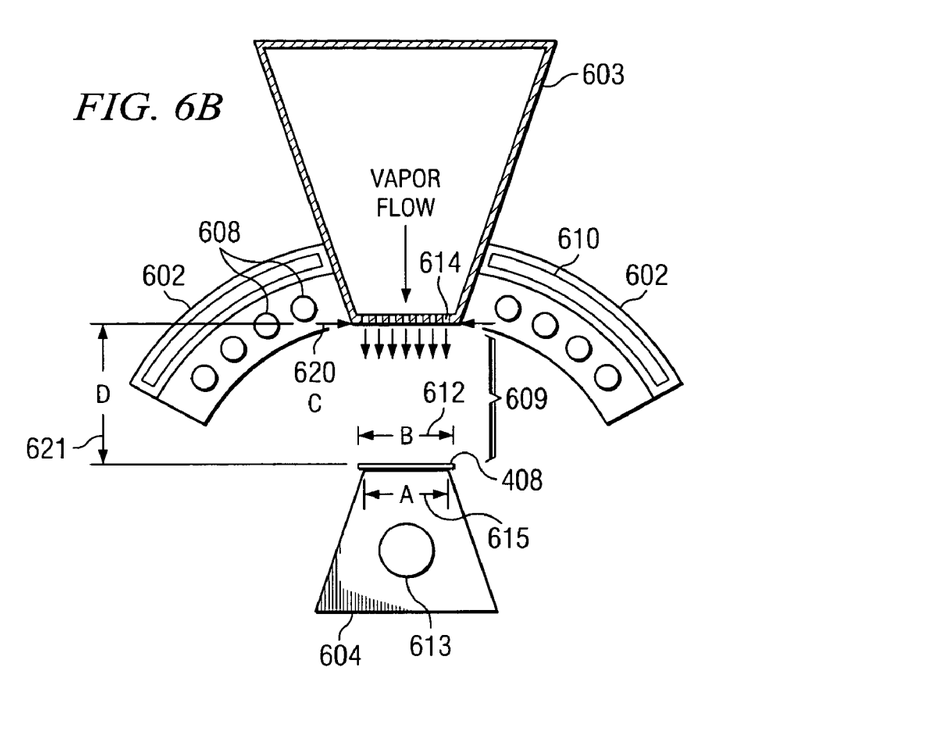
Figure 6C:
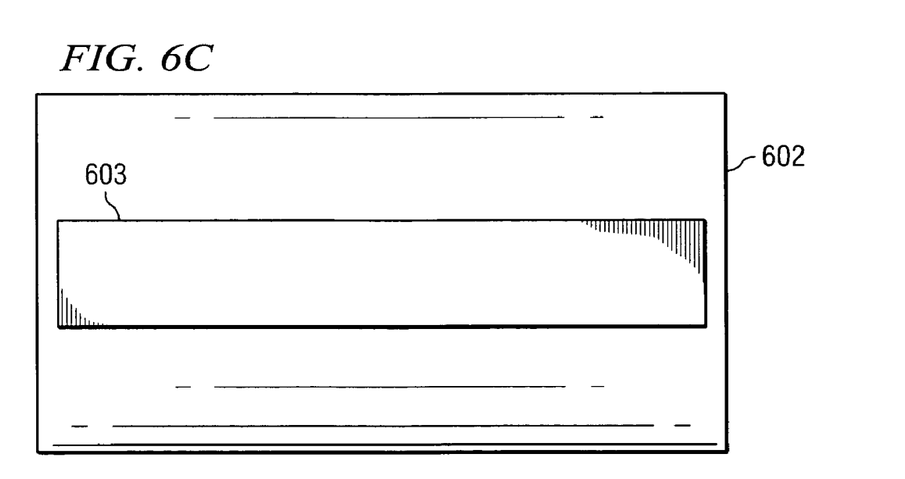
Figure 6D:
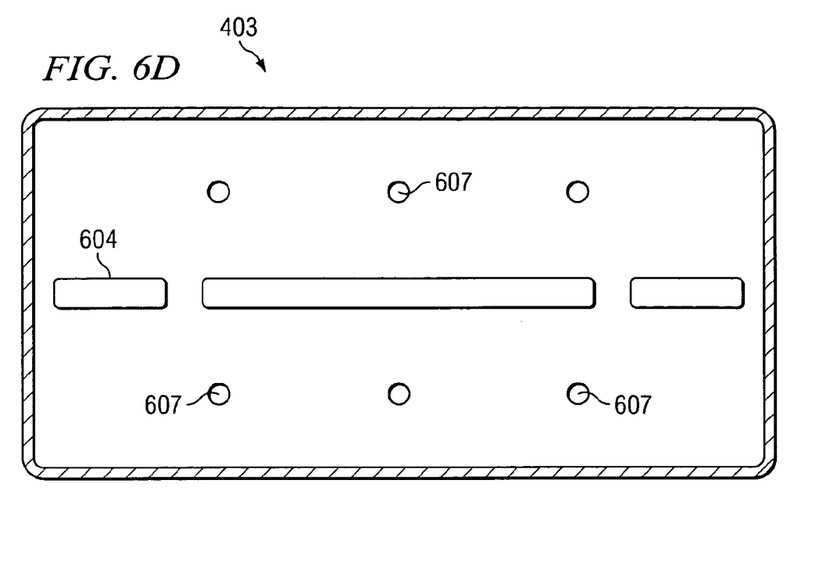
Figures 6E, 6F:
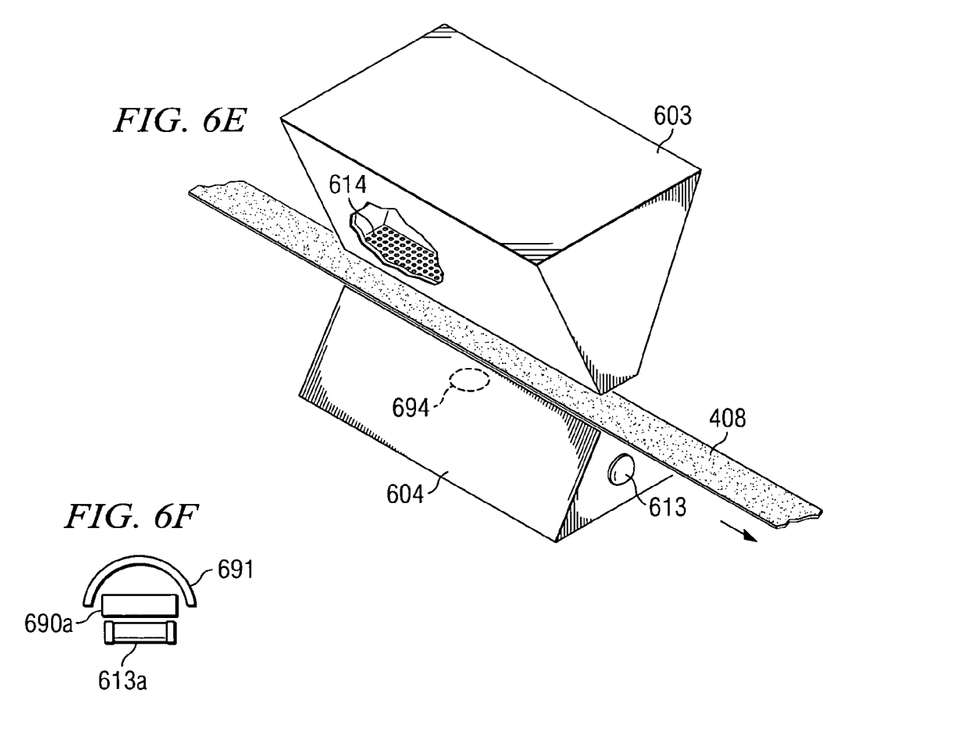

As shown in FIG. 6F, the tape ports 605 and 606 may have adjacent supports 690*a* and 690*b*, preferably composed of stainless steel. Other materials could include quartz, gold, platinum, aluminum oxide, $LaAlO_3$, $SrTiO_3$, and/or other metal oxide materials. The support should be polished smooth, so as not to snag or kink the tape, which would damage the atomic ordering of the substrate, and result in reduced quality HTS film. Also, the support should only be as large as necessary to prevent sag, this will minimize contact with the tape and prevent contamination. The support may include a heater to supplement heat provided by the heating element(s) 613*a*, e.g. a lamp. This prevents the support from acting as a heat sink.

The reactor 601 includes a lamp housing 602 and shower head (or distribution head) 603. FIGS. 6B and 6C depict a side view and a top view, respectively, of the lamp housing 602 and shower-head 603 arrangement shown in FIG. 6A. FIG. 6E depicts a perspective view of the shower head, substrate, and support (note that the lamp housing 602 has been omitted in this view). Lamps 608 in the lamp housing 602 heats the tape to a desired temperature, which will allow for the deposition of materials. The lamp also provides ultraviolet and visible light which significantly enhances the growth rate, i.e. increases the speed of growth through enhanced surface diffusion of the reacting species, which in turn allows for rapid growth of thick layers, and faster tape speeds and/or smaller reactors. The lamp housing 602 uses a reflector to direct the light onto the reaction area 609, which is the area immediately beneath the shower-head 603. This reduces heat flux to the chamber walls. The lamp 608 is preferably a quartz halogen lamp with the light source in the reactor comprising a plurality of lamps 608 that extend along the length of the lamp housing 602. Note that other ultra-violet/visible (UV/V) light sources may be used, for example xenon discharge, mercury vapor, or excimer laser light. The shower-head 603 provides a laminar flow of the reactant vapors mixed with a carrier gas to the deposition region of the reactor at the substrate tape 408. The shower-head 603 is preferably made from stainless steel, but may also be another non-reacting material such as quartz, gold, platinum, aluminum oxide, $LaAlO_3$, $SrTiO_3$, and/or other metal oxide materials.

The area below the shower-head is the deposition region of the reactor. The size of this region is selected with respect to other system characteristics, e.g. the tape speed, deposition rate, chamber pressure, etc. to produce a film of a desired thickness. When not in the deposition region, the tape 408 is covered by shields 691 to prevent material from coating the tape.

The dimensions and placement of the distribution head 603 depend on the width of the substrate 408. For example, as shown in FIG. 6B, for a substrate 408 having a width B 612, the width A 615 of the support 604 is preferably slightly smaller than B, e.g. B minus 2 mm. However, A may be operative for values in the range of B plus 2 mm to B minus 2 mm. The width C 620 of the shower head is preferably larger than B, e.g. B plus 10 mm. However, C may be operative for values in the range of B plus 15 mm to B minus 2 mm. The spacing D 621 between the shower head and the substrate is preferably greater than or equal to B. However, D may be operative for values of greater than or equal to B/2.

The lamp housing 602 also preferably includes a cooling jacket 610 as part of the lamp reflector. Different coolants may be used in the jackets, e.g. water, oil, glycol, etc. The sides of the reactor may also include cooling jackets and/or cooling pipes 614. The cooling jacket(s) not only reduce the reaction chamber external temperature to a safe range, but also reduce unwanted buildup of deposition materials on the walls by reducing the wall temperature to a point where chemical reaction of species does not occur.

The reactor also may preferably include one or several quality control ports 611. This port would allow viewing of the tape during the deposition process, and/or permit access for testing the quality of the tape.

The deposition materials (reactant chemicals) or precursors that react at the substrate to form the deposited film, e.g. HTS, buffer layer or overcoat layer, are provided by precursor system 407. Known systems include gas, liquid, solid and slurry preparation systems. Solid precursor delivery systems typically volatilize the solid precursor in a separate heated vessel, pass a carrier gas through the vessel, and then pass the carrier gas/precursor vapor to the reaction chamber. The solid precursors could be separate or mixed as solids into one mass for vaporization. Slurry precursor delivery systems vaporize, in a separate chamber equipped with a hot zone, small amounts of a thick slurry containing all or a subset of all of the precursors dissolved in a solvent to form the slurry. The liquid precursor delivery system, vaporizes in a separate chamber equipped with a hot zone, small amounts of a liquid solution containing all or a subset of all of the precursors dissolved in a solvent. The vaporized precursors may then be injected into the reactor shower head for delivery to the tape 408. A liquid precursor solution can also be atomized and then vaporized for injection into the reactor shower head.

For the integration of YBCO superconductors with continuous metal foil substrates, three reactors may be used. The first two reactors provide buffer layers, and the third reactor provides the YBCO layer. The first reactor 601*a* deposits a thin layer of buffer, preferably cerium oxide ($CeO_2$). The buffer layers suffice to prevent other diffusion of speed between the metal substrate and the superconducting layer, as well as provide an atomically ordered template onto which to grow atomically ordered subsequent buffer layers or superconductor layers. This layer is deposited at relatively low temperature, as compared to the next two reactors, and prevents the nickel from oxidizing, which would destroy the atomic structure of the nickel substrate surface on which the follow-on layers are grown. Note that this reactor may operate in a reducing environment of forming gas, e.g. hydrogen, but also grows an oxide layer, which means that oxygen may be also provided into the reactor. Because of the relatively low concentrations and pressures (as compared with a standard atmosphere), there is no risk of explosion. The following table provides a working example of the environment of the first reactor. The values are preferred values, as well as useable values, which are provided by way of example only.

TABLE 2

$C_eO$ BUFFER LAYER BY REACTOR 601A

| Variable | Preferred | Operating |
|---|---|---|
| Reactor Temperature | 600-700° C. | 550-750° C. |
| Reactor Pressure | 2-4 Torr | 1-10 Torr |
| Carrier Gas Flow Rate | 100-400 SCCM | 100-400 SCCM |
| Oxygen Flow Rate | 250-700 SCCM | 200-1000 SCCM |
| Reducing Gas | $H_2$ 22-26% | 3-30% |
|  | Ar 78-74% | 97-70% |
| Reducing Gas Flow Rate | 200-600 SCCM | 100-1000 SCCM |

The second reactor 601b deposits a higher deposition temperature buffer layer, preferably yittria stabilized zirconia (YSZ) buffer. This buffer layer prevents the inter-diffusion of the first buffer layer and the metal substrate into the YBCO layer. This reactor operates in an oxidizer-rich environment composed of $O_2$, $N_2O$, $O_3$, combinations thereof, or other oxidizing agents at a pressure of from 1 to 5 Torr, and at a temperature of 600-850° C. The following table provides a working example of the environment of the second reactor. The values are preferred values, as well as useable values, which are provided by way of example only.

TABLE 3

YSZ BUFFER LAYER BE REACTOR 601B

| Variable | Preferred | Operating |
|---|---|---|
| Reactor Temperature | 780-830° C. | 750-850° C. |
| Reactor Pressure | 2-4 Torr | 1-10 Torr |
| Oxygen Flow Rate | 300-600 SCCM | 100-750 SCCM |
| Argon Flow Rate | 500-8000 SCCM | 200-2000 SCCM |

The third reactor 601c deposits the YBCO layer also in an oxidizer-rich environment. The thickness of the YBCO layer and its chemical purity and crystalline quality determine the critical current of the fabricated superconducting tape. The critical current is the current beyond which the superconductor is no longer superconducting. The following table provides a working example of the environment of the third reactor for precursors in solid form. The values are preferred values, as well as useable values, which are provided by way of example only.

TABLE 4

YBCO LAYER BY REACTOR 601C USING SOLID FORM PRECURSORS

| Variable | Preferred | Operating |
|---|---|---|
| Reactor Temperature | 780-835° C. | 750-850° C. |
| Reactor Pressure | 2-4 Torr | 1-10 Torr |
| Precursor $B_a$ Temperature | 270-280° C. | 265-285° C. |
| Precursor $C_u$ Temperature | 165-185° C. | 150-190° C. |
| Precursor Y Temperature | 165-185° C. | 150-190° C. |
| Oxygen Flow Rate | 100-500 SCCM | 100-1000 SCCM |
| $N_2O$ Flow Rate | 100-300 SCCM | 100-1000 SCCM |
| Argon Flow Rate | 500-800 SCCM | 300-2000 SCCM |

The following table provides a working example of the environment of the third reactor for precursors in liquid (Table 5) forms. The values are preferred values, as well as useable values, which are provided by way of example only. Note that M is molality.

TABLE 5

YBCO LAYER BY REACTOR 601C USING LIQUID FORM PRECURSORS

| Variable | Preferred | Operating |
|---|---|---|
| Reactor Temperature | 780-830° C. | 700-900° C. |
| Reactor Pressure | 2-3 Torr | 1-10 Torr |
| Precursor Temperature | 270-280° C. | 260-310° C. |
| Precursor Concentration | 0.05-0.1 M | 0.01-0.5 M |
| Argon Flow Rate | 400-500 SCCM | 200-1000 SCCM |
| Oxygen Flow Rate | 300-500 SCCM | 200-1000 SCCM |
| $N_2O$ Flow Rate | 200-500 SCCM | 100-1000 SCCM |

Note that system 400 may be configured for a two reactor version, namely, one reactor for a single buffer layer and the other reactor for the superconductor layer. The first reactor would be configured as described in Table 2, but use a SM-doped $CeO_2$ as the buffer material. The second reactor may be configured as in either Table 4 or Table 5 for either solid form precursor or liquid form precursor, respectively, for the YBCO superconductor material.

The deposition stage 403 also includes transition chambers 701 between stage 402 and the first reactor, between reactors, and between the last reactor and stage 404. FIG. 7A depicts an example of an embodiment of a transition chamber. The tape feeds into the transition chamber via narrow slit 703 and passes out of the transition chamber via narrow slit 704. The slits are used to minimize the passage of gases and other materials from reactor chamber to transition chamber, and vice versa. Therefore, the transition chambers isolate each stage or reactor from the other stages and/or reactors, and thereby prevent cross-contamination of materials and/or gases from one stage or reactor to another stage or reactor. The transition chamber has a vacuum system 706 that controls any materials or gases leaking in from either end of the transition chamber, and may be operated at a pressure that is either higher or lower than the nominal reaction chamber pressure.

The transition chamber may include at least one support 702 for the moving tape substrate, preferably composed of stainless steel or a non-reactive material such as quartz, gold, platinum, aluminum oxide, $LaAlO_3$, $SrTiO_3$, and/or other metal oxide materials. The support should be polished smooth, so as not to snag or kink the tape, which would damage the atomic ordering of the substrate, and result in reduced quality HTS film. Also the support should only be as large as necessary to prevent sag, this will minimize contact with the tape and prevent contamination.

Figure 7B:
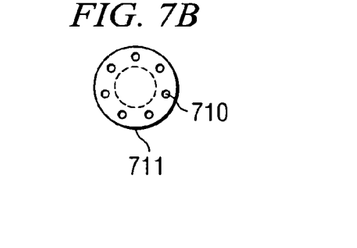

The transition chamber may include one or more heating elements 707 that allow the temperature of the tape to be maintained and/or adjusted while in the transition chamber. The heater 707 may maintain the temperature of the tape, or it may adjust the temperature (either higher or lower) to a point, e.g. midpoint, between the two stages connected to it. For example, if one reactor has a temperature of 550° C. and the other reactor has a temperature of 700° C., then the transition chamber may be set to have a temperature of 625° C. This will reduce thermal shock of the tape, as it moves between stages and/or reactors. Note that in this embodiment, the heating element 707 includes supporting pipe 711. This pipe 711 has a plurality of ports 710, which allows the passage of gases and/or other materials into and/or out of the pipe. FIG. 7B depicts a side view of the pipe 711 with ports 710.

The transition chamber preferably includes at least one port 705 to allow the introduction of at least one gaseous specie into the transition chamber that could stabilize or enhance the buffer layer (s) or the superconductor layer(s)

formed on the substrate, or enhance the formation of follow-on layers on the tape. For example, a transition chamber may provide oxygen to the tape, which would help maintain oxygen stoichiometry in the deposited films. Any introduced gaseous materials would be removed by vacuum system 706.

The transition chamber also preferably includes a cooling jacket 708. Different coolants may be used in the jackets, e.g. water, oil, glycol, etc. The cooling jacket not only reduce the external temperature to a safe range, but also may reduce unwanted buildup of deposition materials on the walls by reducing the wall temperature to a point where chemical reaction of species does not occur.

The transition chamber also may preferably include one or more quality control ports 709. This port would allow viewing of the tape during the deposition process, and/or permit access for testing or monitoring the quality of the tape.

The following table provides working examples of the environments of the transition chambers 701-1, 701-2, 701-3, and 701-4. The values are preferred values, as well as useable values, which are provided by way of example only.

TABLE 6

TRANSITION CHAMBER ENVIRONMENTS

| Chamber | Variable | Preferred | Operating |
|---|---|---|---|
| 701-1 | Temperature | 500° C. | 400-700° C. |
| | Pressure | 3 Torr | 1-10 Torr |
| | Gas Composition: $H_2$ | 22-26% | 3-30% |
| | Ar | 78-74% | 97-70% |
| | Gas Flow Rate | 500 SCCM | 100-1000 SCCM |
| 701-2 | Temperature | 600° C. | 450-800° C. |
| | Pressure | 3 Torr | 1-10 Torr |
| | Gas Composition: $O_2$ | 100% | 100% |
| | Gas Flow Rate | 500 SCCM | 100-2000 SCCM |
| 701-3 | Temperature | 700° C. | 650-850° C. |
| | Pressure | 3 Torr | 1-10 Torr |
| | Gas Composition: $O_2$ | 100% | 100% |
| | Gas Flow Rate | 500 SCCM | 100-1500 SCCM |
| 701-4 | Temperature | 650° C. | 600-800° C. |
| | Pressure | 10 Torr | 2-100 Torr |
| | Gas Flow: $O_2$ | 500 SCCM | 300-2000 SCCM |
| | $N_2O$ | 300 SCCM | 300-2000 SCCM |

The next stage is the anneal stage 404. This stage allows for increasing the oxygen stoichiometry in the superconducting layer on the substrate tape, and cools down the complete processed tape. After this stage, the tape can be exposed to normal air with no degradation of the superconducting layer, and thus no further transition chambers are required. The tape is in this stage for about 30-60 minutes. The tape is at about 800-650° C. when it enters this stage and is about 300° C. or lower when it exits this stage. The tape is in an oxygen atmosphere in this stage.

Figure 8:
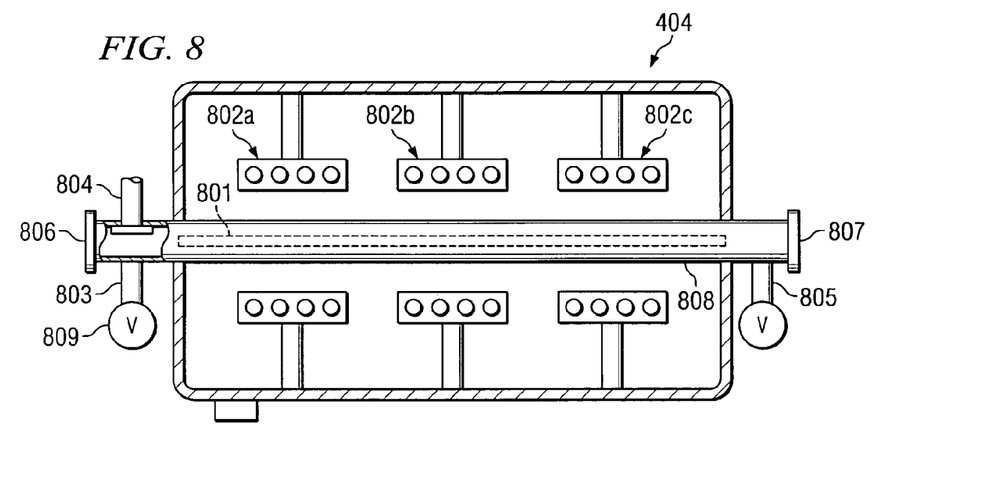
FIG. 8 depicts an embodiment of an anneal stage of the invention.

FIG. 8 depicts an example of an anneal stage. This stage includes at least one support 801, preferably composed of stainless steel or a non-reactive material such as quartz, gold, platinum, aluminum oxide, $LaAlO_3$, $SrTiO_3$, and/or other metal oxide materials. The support should be polished smooth, so as not to snag or kink the tape, which would damage the atomic ordering of the substrate, and result in reduced quality HTS film. Also, the support should only be as large as necessary to prevent sag, this will minimize contact with the tape and prevent contamination. Heater 802 is used to heat the tape. Heater 802 may comprise a plurality of stages, e.g. 802a, 802b, 802c, wherein each stage decrements the temperature of the tape to a desired temperature. This will reduce thermal shock of the tape substrate. Note that in this embodiment, the heater includes supporting pipe 808. This pipe may have a plurality of ports (not shown), which allows the passage of gases and/or other materials into and/or out of the pipe. The tape feeds into this stage via tape port 806 and passes out of this stage via tape port 807. Note that tape ports 806 and 807 are not required to be narrow slits, like those on the transition chambers 701. Alternatively, the narrow slits may not be part of the transition chambers, and instead tape ports 806 and 807 may comprise narrow slits.

Material port 804 provides an inlet for the gases (if any) that are to be used to define the environment in this stage. Ports 803, 505 may be connected to one or more vacuum sources 809 to prevent leakage of the atmosphere into an adjacent stage and/or leakage of the atmosphere of an adjacent stage into stage 404. Note that instead of using lamp heater(s), coil heater(s) similar to those shown in FIG. 5 may be used.

The following table provides a working example of the environment of the anneal stage. The values are preferred values, as well as useable values, that are provided by way of example only.

TABLE 7

ANNEAL STAGE ENVIRONMENTS

| Stage | Variable | Preferred | Operating |
|---|---|---|---|
| Stage I 802a | Temperature | 550° C. | 500-700° C. |
| | Pressure | 760 Torr | 100-1500 Torr |
| | $O_2$ Flow | 500 SCCM | 100-2000 SCCM |
| Stage II 802b | Temperature | 350° C. | 300-500% C. |
| | Pressure | 760 Torr | 100-1500 Torr |
| | $O_2$ Flow | 500 SCCM | 100-2000 SCCM |
| Stage III 802c | Temperature | 200° C. | $\leq 300°$ C. |
| | Pressure | 760 Torr | 100-1500 Torr |
| | $O_2$ Flow | 500 SCCM | 100-2000 SCCM |

Optional sealing stage 405 may coat the tape with a protective coating, e.g. lacquer, plastic, polymer, cloth, metal (e.g. silver, gold, or copper). This materials are cited by way of example only as other coatings could be used.

Optional stage 418 performs quality control testing that ensures the proper characteristics of the final superconducting tape, as well as the tape under process. Note that this stage may use the ports 611 and/or 709. Further note that quality control testing may be incorporated at any of the reactors 601a, b, c, in any of the transition chamber chambers 701, and/or at the pre-treat or post anneal stages. Further note that quality control testing may be performed separately from system 400. This quality control may incorporate direct or indirect measurement of YBCO properties including atomic order, temperature, reflectivity, surface morphology, thickness, microstructure, $T_c$, $J_c$, microwave resistivity, etc., or the direct or indirect measurement of the properties of the buffer layers or the coating layers of the tape including atomic order, temperature, reflectivity, surface morphology, thickness, microstructure, etc. Note that $J_c$ is the critical current density or the maximum amount of current that the wire can handle before breakdown. Some superconductor elements may have a $J_c$ of 100,000 amps/cm$^2$ or greater. Good superconductor elements may have a $J_c$ of 500,000 amps/cm$^2$ or greater.

The system uses a take-up reel 406 to spool the superconducting tape. Note that the length of the wire tape 408 is limited only by the size of the pay-out and take-up reels. Thus, the tape may be any desired length, depending on the length of the input/output reels. For example, the system may produce 1 or 2 kilometer (km) long wire tapes, or even longer.

Note that computer 409 can be used to control the different aspects of the system. For example, it can control the concentration of materials flowing into the reactors, the temperature of the reactors and/or the transition chambers the pressure in the reactors and/or transition chambers, the tape speed, the tape tension, the flow rate of the materials into the different reactors or stages, etc. This would allow feedback from the quality control testing to improve the characteristics of the wire tape.

The system 400 also may optionally include pressure control chambers 414 and 415, which assist in controlling the pressure in the initialization stage 402 and the anneal stage 404, respectively. A transition chamber 701 may be used as a pressure control chamber. In such a case, the heating element 707, supporting pipe 711, and/or water jacket 708 may not be needed. Also narrow slits may not be used between chamber 414 and stage 402, and/or between chamber 415 and stage 404. The system may also use an additional transition chamber 413 between initialization stage 402 and normal atmosphere, or between chamber 414 (if used) and normal atmosphere. Chamber 413 prevents the mixing of normal atmosphere and the environment of the initialization stage 402. For example, chamber 413 prevents oxygen from the normal atmosphere from entering initialization stage 402, as well as preventing hydrogen from the initialization stage from entering the normal atmosphere.

The system uses vacuum pumps 417 to achieve the desired pressure in the various components of the system. Liquid nitrogen traps and filters 416 are used to remove materials from the exhaust of the reactors 601 to prevent damage to the pumps 417. The other components may also use such traps and/or filters to prevent damage to their associated pumps.

Figure 9A:
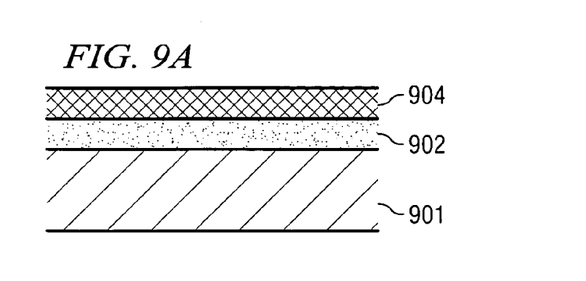
FIGS. 9A-9D depict different embodiments of the inventive superconductivity wire.
Figure 9B:
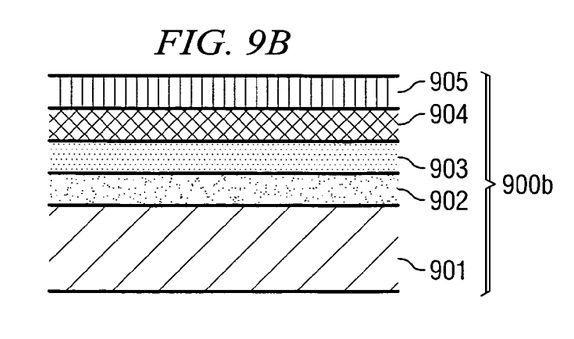

FIGS. 9A-9D depict examples of different embodiment of the inventive superconducting wire produced by the system of FIG. 4. FIG. 9A depicts tape substrate 901 with buffer layer 902 and HTS layer 904. FIG. 9B depicts tape substrate 901 with buffer layers 902, 903, HTS layer 904, and sealing layering 905.

Figure 9C:
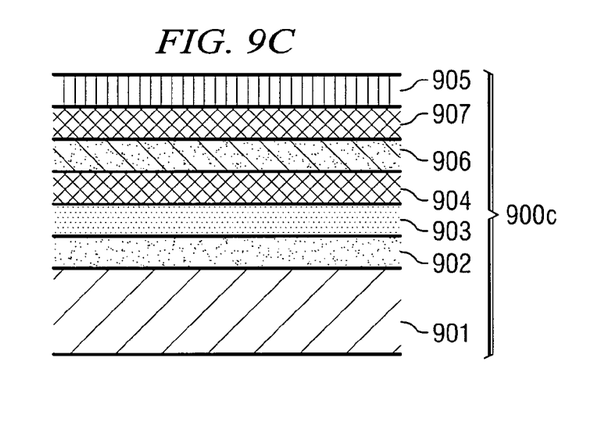

FIG. 9C depicts a two HTS layer wire that includes substrate 901 with buffer layers 902, 903 and sealing layer 905. Buffer layer 906 separates first HTS layer 904 and second HTS layer 907. Note that the buffer layer 906 may be used here, and 906 is not necessarily equivalent to either 902 or 903. This wire may be made by using additional reactors, transition chambers, and/or other components in the system of FIG. 4 to form the additional layers. This wire may also be made by repeating the processing with the system of FIG. 4. In other words, after completion of the first HTS layer, the wire is spooled without adding the sealing layer. The spool is then moved to the pay-out reel 401. Selected ones of the components of the system of FIG. 4 are then used to form the subsequent layers including the second HTS layer.

Figure 9D:
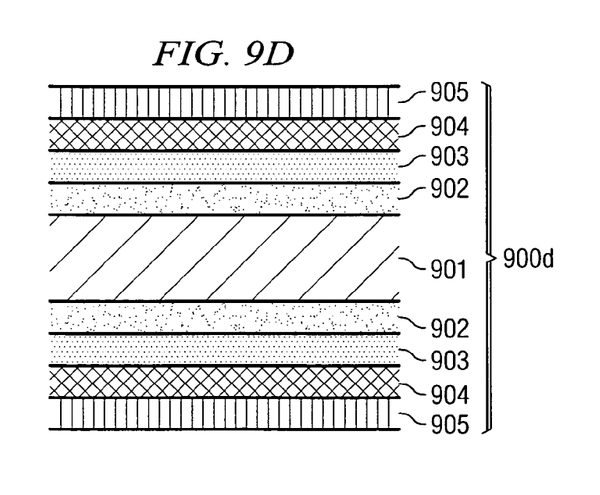

FIG. 9D depicts another example of a two HTS layer wire that has an HTS layer on each side of the substrate. his wire may be made by using additional reactors, transition chambers, and/or other components in the system of FIG. 4 to form the additional layers. In order to form layers on the opposite side, additional pieces of equipment would be added to the system of FIG. 4 that twists or flips the tape as needed to process the bottom side of the tape. This wire may also be made by repeating the processing with the system of FIG. 4. In other words, after completion of the first HTS layer, the wire is spooled without adding the sealing layer. To reverse the side of the tape, the take-up reel 406 would wind the tape from the bottom of the reel (counter-clockwise), instead of the top of the reel (clock-wise), as shown in FIG. 4. The spool is then moved to the pay-out reel 401. The system of FIG. 4 then processes the tape to form the subsequent layers including the second HTS layer.

The inventive wire may be used in the transporting of current, the distribution of power, in an electric motor, in an electric generator, in a transformer, in a fault current limiter, in superconducting magnetic energy storage (SMES) system, and a variety of magnets (including, but not limited to, MRI systems, magnetic levitation transport systems, particle accelerators, and magnetohydrodynamic power systems).

The inventive system may be used to form the inventive superconducting wire from different superconducting materials, including, but not limited to $YBa_2Cu_3O_{7-x}$, YBCO, $NdBa_2Cu_3O_{7-x}$, $LaBa_2Cu_3O_{7-x}$, $Bi_2Sr_2Ca_2Cu_3O_y$, $Pb_{2-x}Bi_xSr_2Ca_2Cu_3O_y$, $Bi_2Sr_2CaCu_2O_z$, $Tl_2Ba_2CaCu_2O_x$, $Tl_2Ba_2Ca_2Cu_3O_y$, $TlBa_2Ca_2Cu_3O_z$, $Tl_{1-x}Bi_xSr_{2-y}Ba_yCa_2Cu_4O_z$, $TlBa_2Ca_1Cu_2O_z$, $HgBa_2CaCu_2O_y$, $HgBa_2Ca_2Cu_3O_y$, $MgB_2$, copper oxides, rare earth metal oxides, and other high temperature superconductors. The invention may also include different buffer materials, including but not limited to $CeO_2$ (or CEO), $Y_2O_3$—$ZrO_2$ (or YSZ), $Gd_2O_3$, $Eu_2O_3$, $Yb_2O_3$, $RuO_2$, $La_{1-x}Sr_xCoO_3$, MgO, SiN, $BaCeO_2$, NiO, $Sr_2O_3$, $SrTiO_3$, and $Ba_{1-x}Sr_xTiO_3$.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a superconducting wire with a tape substrate, the method comprising:
   dispensing the tape substrate from a first reel;
   introducing the tape substrate into at least one reaction chamber comprising at least one distribution head and at least one light source;
   dispensing a laminar flow of reactant materials mixed with a carrier gas from the at least one distribution head to a deposition region between the at least one distribution head and the substrate surface to continuously form at least one layer of buffer material on the tape substrate;
   introducing the tape substrate into at least one transition chamber comprising at least one heating element to adjust the temperature of the tape substrate;
   introducing the tape substrate into at least one other reaction chamber comprising at least one distribution head and at least one light source;
   dispensing a laminar flow of reactant materials mixed with a carrier gas from the at least one distribution head to a deposition region between the at least one distribution head and the substrate surface to continuously form a layer of the superconductor material on the layer of buffer material; and
   spooling the tape substrate comprising the layers of buffer material and superconductor material onto a second reel, wherein UV light, visible light, or a combination of UV and visible light is directed from the light source to the surface of said substrate with a reflector during the formation of at least one of the layers of buffer material and superconductor material; and wherein the tape substrate is exposed to normal atmosphere during at least one of the dispensing step and the spooling step.

2. The method of claim 1, wherein the reaction chambers are modular reaction chambers capable of being removed or added as needed.

3. The method of claim 1, wherein at least one of the reaction chambers is operated in a neutral operating mode.

4. The method of claim 3, wherein operating the at least one reaction chamber in a neutral operating mode:

maintains the tape substrate at a predetermined temperature; and provides a non-reactive atmosphere.

5. The method of claim 1, wherein continuously forming the layer of superconductor material comprises performing a film deposition process chosen from:

metalo-organic chemical vapor deposition (MOCVD);
pulsed laser deposition;
dc/rf sputtering;
vapor deposition;
metal organic deposition;
molecular beam epitaxy; and
sol gel processing.

6. The method of claim 1, comprising introducing the tape substrate into a first reaction chamber to form a buffer layer of cerium oxide, a second reaction chamber to form a buffer layer of yttria stabilized zirconia, and a third reaction chamber to form a layer of YBCO on one of the buffer layers.

7. The method of claim 1, wherein the reactant materials comprise a liquid precursor material that is dispensed to form the at least one layer of superconductor material.

8. The method of claim 1, wherein each of the tape substrate, the layer of buffer material, and the layer of superconductor material is continuous and at least one-half kilometer in length.

9. A method for forming a superconductor wire with a tape substrate, the method comprising:

continuously dispensing the tape substrate from a first reel under ambient conditions;

introducing the tape substrate into at least one deposition chamber, wherein the first reel is outside the at least one deposition chamber, the deposition chamber comprising at least one distribution head and at least one light source;

dispensing a laminar flow of reactant materials mixed with a carrier gas from the at least one distribution head to a deposition region between the at least one distribution head and the substrate surface;

providing UV and/or visible light to the tape substrate with the at least one light source, wherein the UV and/or visible light is directed to the substrate surface with a reflector;

forming, continuously, at least one layer of buffer material on the tape substrate and at least one layer of superconductor material on the buffer-coated tape substrate, wherein the at least one layer of buffer material and the at least one layer of superconductor material are formed in separate deposition chambers;

introducing the tape substrate into at least one transition chamber comprising at least one heating element to adjust the temperature of the tape substrate; and spooling the tape substrate comprising the layer of superconductor material onto a second reel under ambient conditions outside the at least one deposition chamber and the at least one transition chamber.

10. The method of claim 9, wherein the at least one light source is chosen from a quartz halogen lamp, a xenon discharge lamp, a mercury vapor lamp, and an excimer laser; and wherein the UV and/or visible light enhances a growth rate of material used to form the layer of superconductor material on the tape substrate.

11. The method of claim 1, wherein the at least one light source is chosen from a quartz halogen lamp, a xenon discharge lamp, a mercury vapor lamp, and an excimer laser.

* * * * *